US010050611B2

(12) United States Patent
Saito

(10) Patent No.: US 10,050,611 B2
(45) Date of Patent: Aug. 14, 2018

(54) OSCILLATION CIRCUIT, VOLTAGE CONTROLLED OSCILLATOR, AND SERIAL DATA RECEIVER

(71) Applicant: ROHM CO., LTD., Ukyo-ku, Kyoto (JP)

(72) Inventor: Shinichi Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 164 days.

(21) Appl. No.: 15/146,242

(22) Filed: May 4, 2016

(65) Prior Publication Data

US 2016/0344378 A1 Nov. 24, 2016

(30) Foreign Application Priority Data

May 20, 2015 (JP) ................. 2015-103094

(51) Int. Cl.
*H03B 27/00* (2006.01)
*H03K 5/15* (2006.01)
*H03L 7/08* (2006.01)
*H04L 7/00* (2006.01)
*G06F 1/06* (2006.01)
*H03K 3/03* (2006.01)
*H03L 7/087* (2006.01)

(52) U.S. Cl.
CPC ............. *H03K 5/1508* (2013.01); *G06F 1/06* (2013.01); *H03B 27/00* (2013.01); *H03K 3/0322* (2013.01); *H03L 7/0807* (2013.01); *H04L 7/0079* (2013.01); *H03L 7/087* (2013.01)

(58) Field of Classification Search
CPC .... H03B 27/00; H03K 3/0315; H03K 3/0322; G06F 1/06; H04L 7/0079
USPC ................................ 331/57, 45, 46
See application file for complete search history.

(56) References Cited

U.S. PATENT DOCUMENTS 6,052,004 A * 4/2000 Saeki ................. H03K 5/00006
327/116

FOREIGN PATENT DOCUMENTS

JP 2002290214 A 10/2002
JP 2011120106 A 6/2011

\* cited by examiner

*Primary Examiner* — Arnold Kinkead
(74) *Attorney, Agent, or Firm* — Cantor Colburn LLP

(57) ABSTRACT

An oscillation circuit includes: an oscillator configured to generate N phase clocks (where N is an integer of 2 or more) including a first phase clock to Nth phase clock whose phases are shifted by 360°/N at regular intervals; a pulse generating part configured to receive a plurality of the N phase clocks and generate a plurality of intermediate pulses each having a duty ratio of 25%; and a clock synthesizing part configured to synthesize the plurality of intermediate pulses to generate a single phase output clock or multi-phase output clocks, the single phase output clock and the multi-phase output clocks having a frequency that is twice an oscillation frequency of the oscillator.

18 Claims, 9 Drawing Sheets

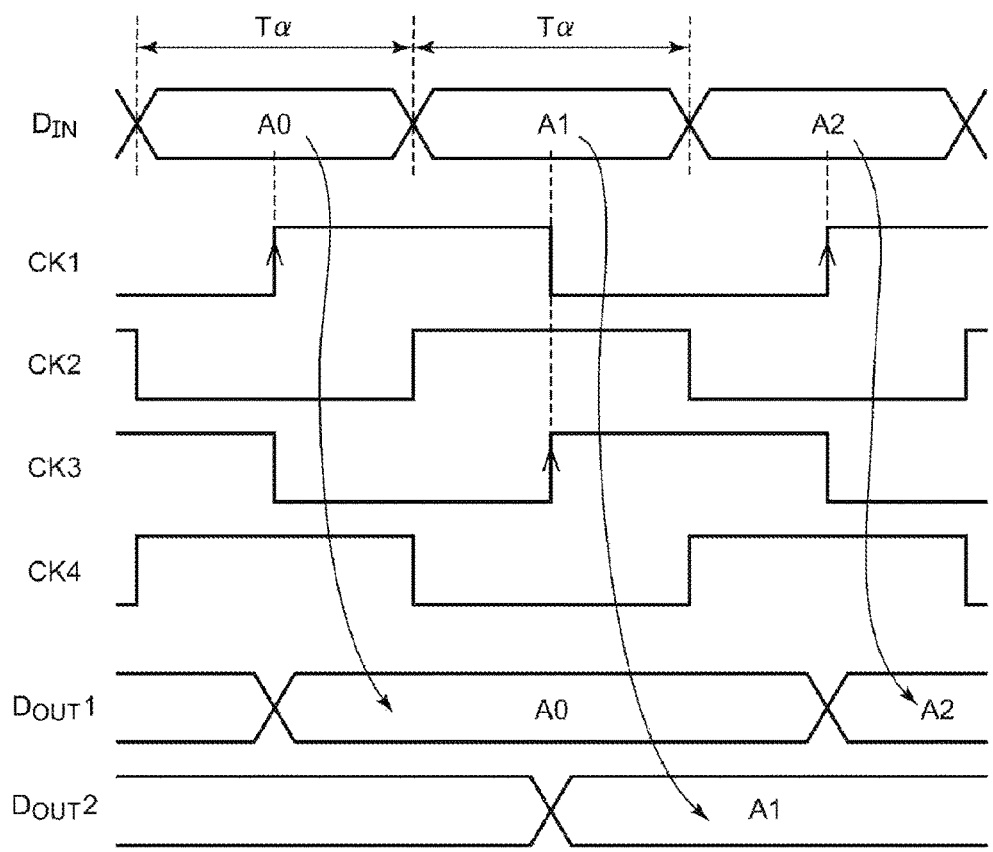

220a

220b

220c

OSCILLATION CIRCUIT, VOLTAGE CONTROLLED OSCILLATOR, AND SERIAL DATA RECEIVER

CROSS-REFERENCE TO RELATED APPLICATION(S)

This application is based upon and claims the benefit of priority from Japanese Patent Application No. 2015-103094, filed on May 20, 2015, the entire contents of which are incorporated herein by reference.

TECHNICAL FIELD

The present disclosure relates to an oscillation circuit.

BACKGROUND

A great deal of digital circuits includes an oscillator for generating a clock. Recently, as an amount of data handled by digital circuits grows, an oscillation frequency of an oscillator has been on the increase. For example, since a data rate of a transmitter that transmits serially transmitted image data or a receiver that receives serially transmitted image data reaches even up to 5 Gbps, a frequency of a few GHz is required as a clock for sampling.

An LC oscillator or a ring oscillator has been used as an oscillator. The LC oscillator easily generates a clock of a few GHz. However, the integration of an inductor on a semiconductor substrate requires a high frequency process, increasing costs. Further, since inductance is fixed, it is difficult to vary an oscillation frequency.

Meanwhile, the ring oscillator is configured by arranging a delay circuit as a base in a ring shape and is configured through a CMOS process or BiCMOS process, which is thus advantageous in terms of costs. In addition, by changing the bias condition of the delay circuit, a delay time thereof can be changed to vary an oscillation frequency.

The ring oscillator is configured by using a plurality of delay circuits connected in multiple stages, and a clock frequency is increased as a delay amount of each of the delay circuits is reduced. However, there is a restriction in a delay amount of the delay circuits that can be configured through a general semiconductor manufacturing process and it is difficult to generate a clock of a few GHz.

SUMMARY

The present disclosure provides some embodiments of an oscillator capable of generating a high speed clock.

According to one embodiment of the present disclosure, there is provided an oscillation circuit. The oscillation circuit includes: an oscillator configured to generate N phase clocks (where N is an integer of 2 or more) including a first phase clock to Nth phase clock whose phases are shifted by 360°/N at regular intervals; a pulse generating part configured to receive a plurality of the N phase clocks and generate a plurality of intermediate pulses each having a duty ratio of 25%; and a clock synthesizing part configured to synthesize the plurality of intermediate pulses to generate a single phase output clock or multi-phase output clocks, the singles phase output clock and the multi-phase output clocks having a frequency that is twice an oscillation frequency of a ring oscillator.

According to this embodiment, it is possible to generate a high speed output clock having a frequency that is twice that of the original oscillator.

In some embodiments, the pulse generating part may be configured to generate one intermediate pulse from a pair of clocks that are 90° out of phase with each other.

In the pulse generating part, a positive edge and a negative edge of the intermediate pulse may be based on an edge having the same polarity of the pair of clocks as a basis of the intermediate pulse. Thus, even when a duty ratio of a multi-phase clock is changed or fluctuates, a duty ratio of an intermediate pulse is hardly affected.

In some embodiments, the pulse generating part may be configured to invert one of the pair of clocks and perform a logical product of an inverted clock and the other clock to generate one intermediate pulse. Alternatively, the pulse generating part may be configured to invert one of the pair of clocks and perform a negative logical sum of an inverted clock and the other clock to generate one intermediate pulse. Thus, a positive edge and a negative edge of the intermediate pulse can be defined by an edge having the same polarity of a pair of clocks.

In some embodiments, the clock synthesizing part may be configured to perform a logical sum of a pair of intermediate pulses that are 180° out of phase to generate one output clock.

In some embodiments, the ring oscillator may be configured to generate four phase clocks CLKA0 to CLKA3 whose phases are shifted by 90°. The pulse generating part may be configured to generate a first intermediate pulse CLKB0 based on a first phase clock CLKA0 and a second phase clock CLKA1 of the four phase clocks, and a second intermediate pulse CLKB2 based on a third phase clock CLKA2 and a fourth phase clock CLK3 of the four phase clocks. The clock synthesizing part may be configured to generate a first output clock CLKC0 based on the first intermediate pulse CLKB0 and the second intermediate pulse CLKB2.

In some embodiments, the pulse generating part may be configured to generate a third intermediate pulse CLKB1 based on the second phase clock CLKA1 and the third phase clock CLKA2 of the four phase clocks, and a fourth intermediate pulse CLKB3 based on the fourth phase clock CLKA3 and the first phase clock CLKA0 of the four phase clocks. The clock synthesizing part may be configured to generate a second output clock CLKC1 based on the third intermediate pulse CLKB1 and the fourth intermediate pulse CLKB3.

The oscillator may be configured to generate four phase clocks CLKA0 to CLKA3 whose phases are shifted by 90°. The pulse generating part may include: a first AND gate configured to generate a logical product of a first phase clock CLKA0 of the four phase clocks and an inverted signal of a second phase clock CLKA1; and a second AND gate configured to generate a logical product of a third phase clock CLKA2 of the four phase clocks and an inverted signal of a fourth phase clock CLKA3. The clock synthesizing part may include a first OR gate configured to generate a logical sum of an output of the first AND gate and an output of the second AND gate.

The pulse generating part may further include: a third AND gate configured to generate a logical product of the second phase clock CLKA1 of the four phase clocks and an inverted signal of the third phase clock CLKA2; and a fourth AND gate configured to generate a logical product of the fourth phase clock CLKA3 of the four phase clocks and an inverted signal of the first phase clock CLKA0. The clock synthesizing part may further include a second OR gate configured to generate a logical sum of an output of the third AND gate and an output of the fourth AND gate.

In some embodiments, the ring oscillator may be configured to generate eight phase clocks CLKA0 to CLKA7 whose phases are shifted by 45°. The pulse generating part may be configured to generate a first intermediate pulse CLKB0 based on a first phase clock CLKA0 and a third phase clock CLKA2 of the eight phase clocks and a second intermediate pulse CLKB4 based on a fifth phase clock CLKA4 and a seventh phase clock CLKA6 of the eight phase clocks, and the clock synthesizing part may be configured to generate a first output clock CLKC0 based on the first intermediate pulse CLKB0 and the second intermediate pulse CLKB4.

In some embodiments, the pulse generating part may be configured to generate a third intermediate pulse CLKB2 based on the third phase clock CLKA2 and the fifth phase clock CLKA4 of the eight phase clocks and a fourth intermediate pulse CLKB6 based on the seventh phase clock CLKA6 and the first phase clock CLKA0 of the eight phase clocks, and the clock synthesizing part may be configured to generate a second output clock CLKC2 based on the third intermediate pulse CLKB2 and the fourth intermediate pulse CLKB6.

In some embodiments, the pulse generating part may be configured to generate a fifth intermediate pulse CLKB1 based on the second phase clock CLKA1 and the fourth phase clock CLKA3 of the eight phase clocks and a sixth intermediate pulse CLKB5 based on the sixth phase clock CLKA5 and the eighth phase clock CLKA7 of the eight phase clocks, and the clock synthesizing part may be configured to generate a third output clock CLKC1 based on the fifth intermediate pulse CLKB1 and the sixth intermediate pulse CLKB5.

In some embodiments, the pulse generating part may be configured to generate a seventh intermediate pulse CLKB3 based on the fourth phase clock CLKA3 and the sixth phase clock CLKA5 of the eight phase clocks and an eighth intermediate pulse CLKB7 based on the eighth phase clock CLKA7 and the second phase clock CLKA1 of the eight phase clocks, and the clock synthesizing part may be configured to generate a fourth output clock CLKC3 based on the seventh intermediate pulse CLKB3 and the eighth intermediate pulse CLKB7.

In some embodiments, the ring oscillator may be configured to generate eight phase clocks CLKA0 to CLKA7 whose phases are shifted by 45°. The pulse generating part may include: a first AND gate configured to generate a logical product of a first phase clock CLKA0 of the eight phase clocks and an inverted signal of a third phase clock CLKA2; a second AND gate configured to generate a logical product of the third phase clock CLKA2 of the eight phase clocks and an inverted signal of a fifth phase clock CLKA4; a third AND gate configured to generate a logical product of the fifth phase clock CLKA4 of the eight phase clocks and an inverted signal of a seventh phase clock CLKA6; and a fourth AND gate configured to generate a logical product of the seventh phase clock CLKA6 of the eight phase clocks and an inverted signal of the first phase clock CLKA0. The clock synthesizing part may include: a first OR gate configured to generate a logical sum of an output of the first AND gate and an output of the third AND gate; and a second OR gate configured to generate a logical sum of an output of the second AND gate and an output of the fourth AND gate.

In some embodiments, the pulse generating part may include: a fifth AND gate configured to generate a logical product of a second phase clock CLKA1 of the eight phase clocks and an inverted signal of a fourth phase clock CLKA3; a sixth AND gate configured to generate a logical product of the fourth phase clock CLKA3 of the eight phase clocks and an inverted signal of a sixth phase clock CLKA5; a seventh AND gate configured to generate a logical product of the sixth phase clock CLKA5 of the eight phase clocks and an inverted signal of an eighth phase clock CLKA7; and an eighth AND gate configured to generate a logical product of the eighth phase clock CLKA7 of the eight phase clocks and an inverted signal of the second phase clock CLKA1. The clock synthesizing part may include: a third OR gate configured to generate a logical sum of an output of the fifth AND gate and an output of the seventh AND gate; and a fourth OR gate configured to generate a logical sum of an output of the sixth AND gate and an output of the eighth AND gate.

In some embodiments, the oscillator may include differential type even number stage delay circuits connected to form a ring shape.

According to another embodiment of the present disclosure, there is provided a voltage controlled oscillator (VCO) including any one of the oscillation circuits described above.

According to still another embodiment of the present disclosure, there is provided a serial data transmitter including any one of the oscillation circuits described above.

According to a further embodiment of the present disclosure, there is provided a serial data receiver including any one of the oscillation circuits described above.

Also, arbitrarily combining the foregoing components or converting the expression of the present disclosure among a method, an apparatus, and the like is also effective as an embodiment of the present disclosure.

BRIEF DESCRIPTION OF THE DRAWINGS

FIG. 7 is a time chart illustrating timing of each signal in the CDR circuit of FIG. 6.

DETAILED DESCRIPTION

Figure 1:
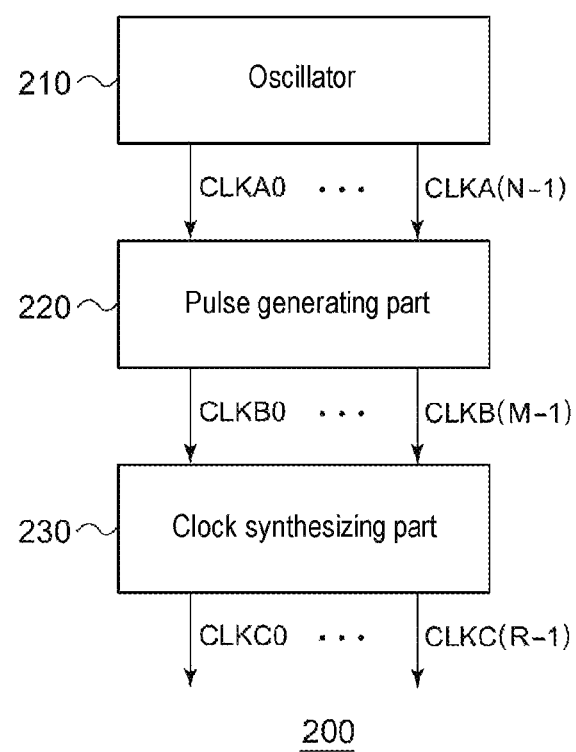
FIG. 1 is a block diagram of an oscillation circuit according to an embodiment.

Embodiments of the present disclosure will be now described in detail with reference to the drawings. Like or equivalent components, members, and processes illustrated in each drawing are given like reference numerals and a repeated description thereof will be properly omitted. Also, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case in which the member A and the member B are indirectly connected through any other member that does not affect an electrical connection state thereof. Similarly, "a state where a member C is installed between a member A and a member B" also includes a case where the member A and the member C or the member B and the member C are indirectly connected through any other member that does not affect an electrical connection state, in addition to a case in which the member A and the member C or the member B and the member C are directly connected.

FIG. 1 is a block diagram of an oscillation circuit 200 according to an embodiment. The oscillation circuit 200 includes an oscillator 210, a pulse generating part 220, and a clock synthesizing part 230.

The oscillator 210 generates N phase clocks (where N is an integer of 2 or more) including first phase clock CLKA0 to Nth phase clock CLKA(N−1) whose phases are shifted by 360°/N at regular intervals.

The pulse generating part 220 receives a plurality of the N phase clocks CLKA0 to CLKA(N−1) and generates a plurality of M intermediate pulses CLKB0 to CLKB(M−1) each having a duty ratio of 25%. Here, M is an integer of 2 or more.

The pulse generating part 220 generates one intermediate pulse CLKBk based on a pair of clocks CLKAi and CLKAj that are 90° out of phase with each other, where i and j are integers (where 0≤i≤N−1 and 0≤j≤N−1). Also, k is an integer (where 0≤k≤M−1).

A positive edge and a negative edge of the intermediate pulse CLKBk may be defined according to an edge (here, a positive edge) having the same polarity of the pair of clocks CLKAi and CLKAj as a basis thereof.

The clock synthesizing part 230 synthesizes a plurality of intermediate pulses CLKB to generate a single phase output clock CLKC0 having a frequency that is twice the oscillation frequency of the oscillator 210 or multi-phase (R phase) output clocks CLKC0 to CLK(R−1). Here, R is an integer of 2 or more.

For example, the clock synthesizing part 230 performs a logical sum (OR) of a pair of intermediate pulses CLKBp and CLKBq that are 180° out of phase with each other to generate one output clock CLKCs. Here, p and q are integers (where 0≤i≤M−1 and 0≤j≤M−1). Also, s is an integer (where 0≤s≤R−1).

The basic configuration of the oscillation circuit 200 has been described above. Next, an operation thereof will be described. Here, the cases of N=4, M=4, and R=2 will be described to help in understanding and simplifying the description.

Figure 2:
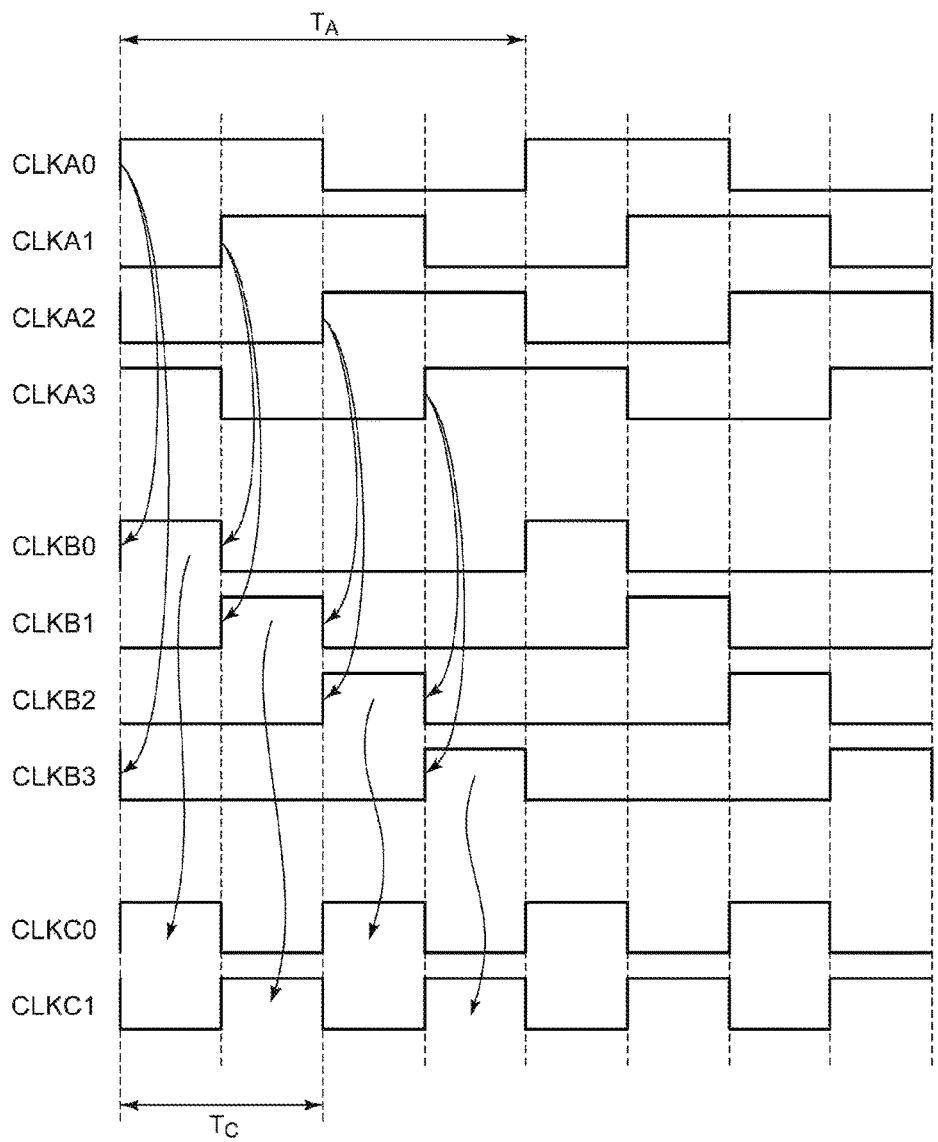
FIG. 2 is an operational waveform view of the oscillation circuit of FIG. 1.

FIG. 2 is an operational waveform view of the oscillation circuit 200 of FIG. 1. The oscillator 210 generates four phase clocks CLKA0 to CLKA3. Upon receipt of the four phase clocks CLKA0 to CLKA3, the pulse generating part 220 generates a plurality of (here, four) intermediate pulses CLKB0 to CLKB3.

The pulse generating part 220 generates a first intermediate pulse CLKB0 based on a first phase clock CLKA0 and a second phase clock CLKA1 of the four phase clocks, and generates a second intermediate pulse CLKB2 based on a third phase clock CLKA2 and a fourth phase clock CLKA3 of the four phase clocks. The clock synthesizing part 230 generates a first output clock CLKC0 based on the first intermediate pulse CLKB0 and the second intermediate pulse CLKB2.

Also, the pulse generating part 220 generates a third intermediate pulse CLKB1 based on the second phase clock CLKA1 and the third phase clock CLKA2 of the four phase clocks, and generates a fourth intermediate pulse CLKB3 based on the fourth phase clock CLKA3 and the first phase clock CLKA0 of the four phase clocks. The clock synthesizing part 230 generates a second output clock CLKC1 based on the third intermediate pulse CLKB1 and the fourth intermediate pulse CLKB3.

The operation of the oscillation circuit 200 has been described above. According to this oscillation circuit 200, it is possible to generate the output clocks CLKC0 and CLKC1 having a period $T_C$ of half the oscillation period $T_A$ of the oscillator 210, i.e., having a double frequency.

Further, the output clocks CLKC0 and CLKC1 may be recognized as 2-phase clocks whose phases are shifted by 180° (½ period). Only one of them may be required according to applications. In this case, the function of generating the CLKC0 (or CLKC1) of the other side may be omitted.

The present disclosure is recognized by the block diagram and circuit diagram of FIG. 1, and encompasses various devices and circuits derived from the above description and is not limited to a specific configuration. Hereinafter, a more specific configuration example will be described in order to facilitate and clarify understanding of the essence and circuitry operation of the disclosure, rather than to narrow the scope of the present disclosure.

First Embodiment

Figure 3:
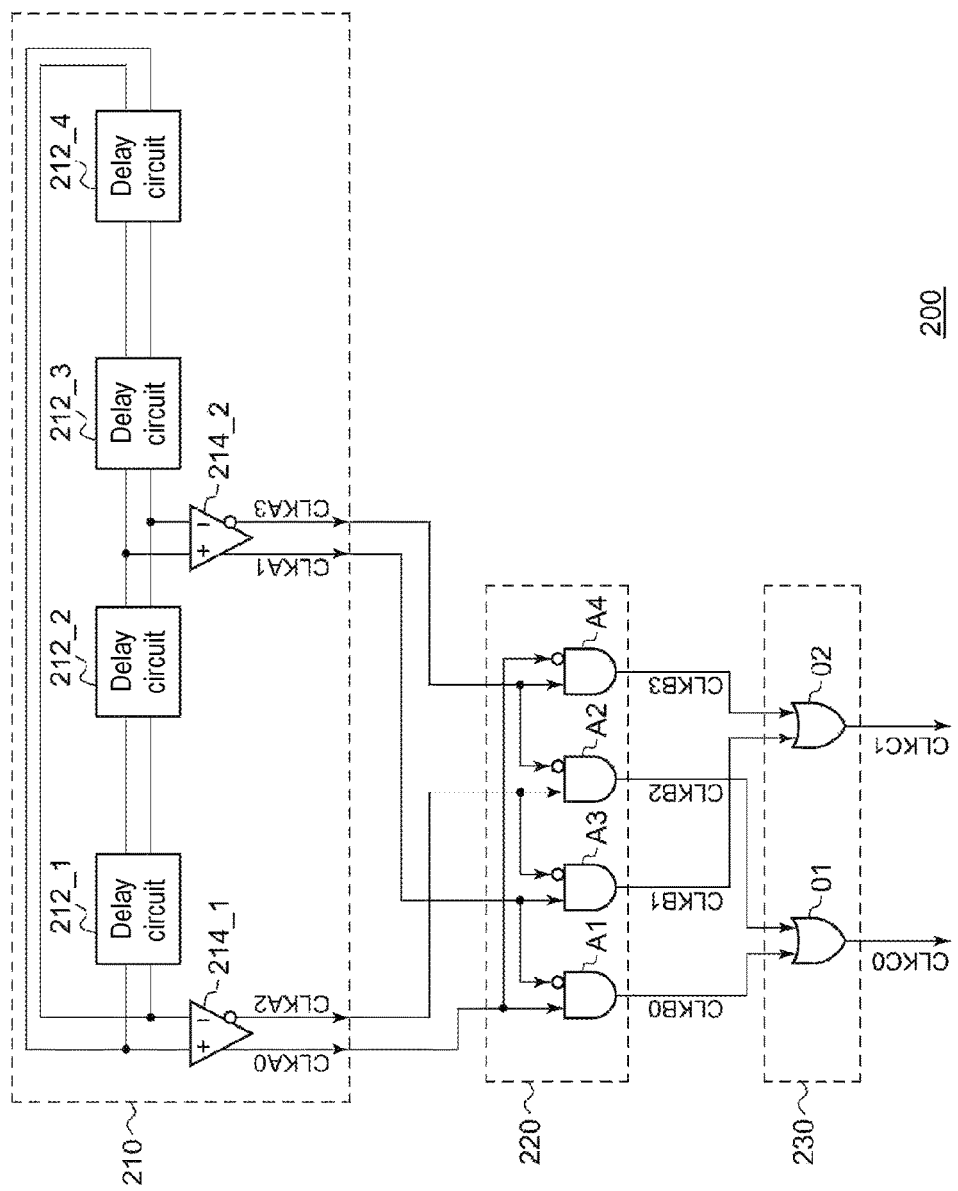
FIG. 3 is a circuit diagram of an oscillation circuit according to a first embodiment.

FIG. 3 is a circuit diagram of the oscillation circuit 200 according to a first embodiment. The oscillator 210 generates four phase clocks CLKA0 to CLKA3 whose phase are shifted by 90°. The oscillator 210 has differential type even number four-stage delay circuits 212_1 to 212_4 connected to form a ring shape and comparators 214_1 and 214_2.

The comparator 214_1 compares differential inputs of a delay circuit 212_1 at a first stage to output a first phase clock CLKA0 representing a comparison result and a third phase clock CLKA2 as a logical inversion thereof. The comparator 214_2 compares differential inputs of a delay circuit 212_3 at a third stage to output a second phase clock CLKA1 representing a comparison result and a fourth phase clock CLKA3 as a logical inversion thereof. When the differential inputs of the delay circuits 212_1 to 212_4 have steep edges and a driving capacity of the delay circuits 212_1 to 212_4 is sufficiently high (output impedance is low), the comparators 214_1 and 214_2 may be omitted.

The pulse generating part 220 includes first AND gate A1 to fourth AND gate A4. The first AND gate A1 performs a logical product (AND) of the first phase clock CLKA0 of the four phase clocks and an inverted signal #CLKA1 of the second phase clock CLKA1 to generate a first intermediate pulse CLKB0. The second AND gate A2 performs a logical product of the third phase clock CLKA2 of the four phase clocks and an inverted signal #CLKA3 of the fourth clock CLKA3 to generate a third intermediate pulse CLKB2. The first intermediate pulse CLKB0 and the third intermediate pulse CLKB2 are 180° out of phase with each other.

The third AND gate A3 performs a logical product of the second phase clock CLKA1 of the four phase clocks and an inverted signal #CLKA2 of the third phase clock CLKA2 to generate a second intermediate pulse CLKB1. The fourth AND gate A4 performs a logical product of the fourth phase clock CLKA3 of the four phase clocks and an inverted signal #CLKA0 of the first clock CLKA0 to generate a fourth intermediate pulse CLKB3. The second intermediate pulse CLKB1 and the fourth intermediate pulse CLKB3 are 180° out of phase with each other.

The clock synthesizing part 230 includes a first OR gate O1 and a second OR gate O2. The first OR gate O1 performs a logical sum (OR) of an output CLKB0 of the first AND gate A1 and an output CLKB2 of the second AND gate A2 to generate a first output clock CLKC0. Also, the second OR gate O2 performs a logical sum of an output CLKB1 of the third AND gate A3 and an output CLKB3 of the fourth AND gate A4 to generate a second output clock CLKB1.

According to the oscillation circuit 200 of FIG. 3, the double frequency and the two phase output clocks CLKC0 and CLKC1 may be generated. When a single phase output clock is required, the set of the third AND gate A3, the fourth AND gate A4, and the second OR gate O2 may be omitted.

In particular, according to the configuration of the pulse generating part 220 and/or a method of generating an intermediate pulse, both a positive edge and a negative edge of the intermediate pulse CLKB are defined by a positive edge of the multi-phase clock CLKA. Thus, the intermediate pulse CLKB is advantageous in that it is not affected by a variation in the duty ratio of the multi-phase clock CLKA.

Second Embodiment

Figure 4:
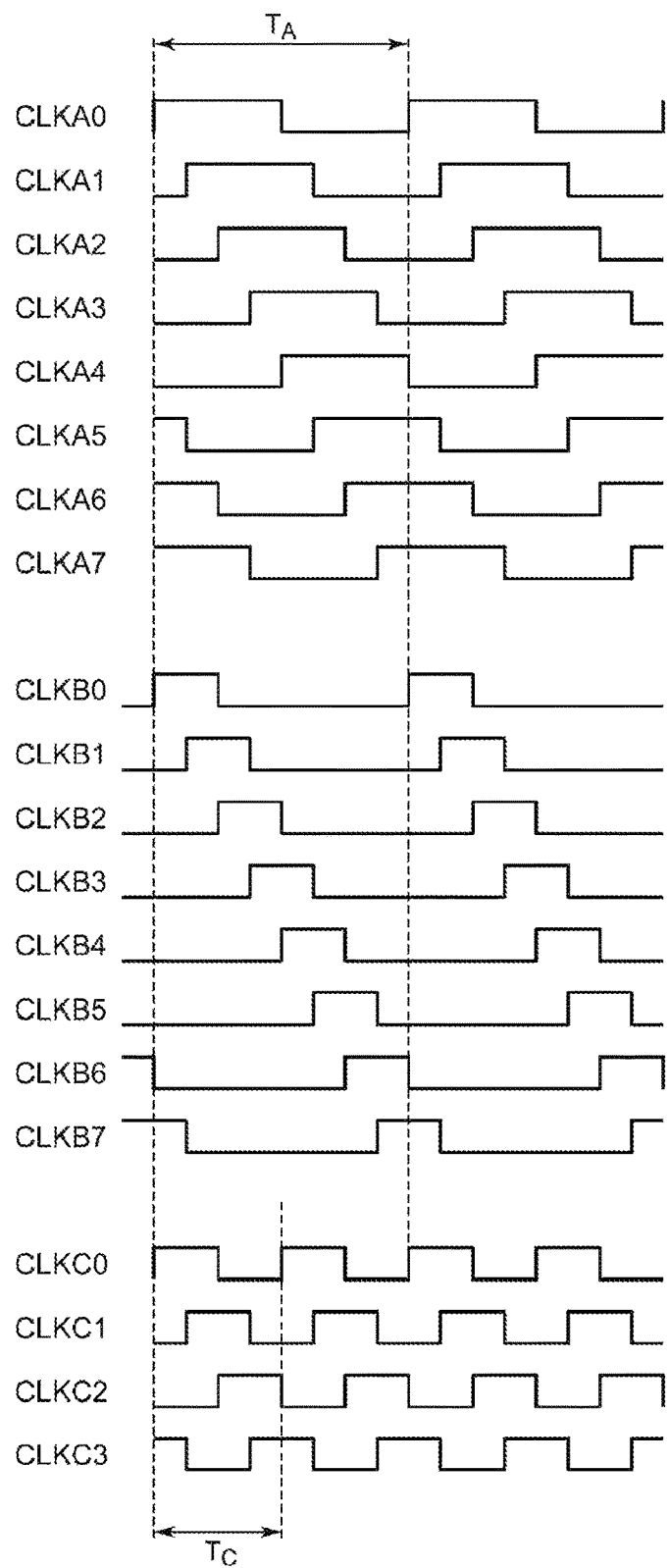
FIG. 4 is another operational waveform view of the oscillation circuit of FIG. 1.

Next, the generation of the double frequency and the four phase output clocks CLKC0 to CLKC3 will be described. FIG. 4 is another operational waveform view of the oscillation circuit 200 of FIG. 1.

The oscillator 210 generates eight phase clocks CLKA0 to CLKA7 whose phases are shifted by 45°. The pulse generating part 220 receives the eight phase clocks CLKA0 to CLKA7 and generates a plurality of (here, eight) intermediate pulses CLKB0 to CLKB7.

The pulse generating part 220 generates a first intermediate pulse CLKB0 based on the first phase clock CLKA0 and the third phase clock CLKA2 of the eight phase clocks, and generates a second intermediate pulse CLKB4 based on a fifth phase clock CLKA4 and a seventh phase clock CLKA6. The clock synthesizing part 230 generates a first output clock CLKC0 based on the first intermediate pulse CLKB0 and the second intermediate pulse CLKB4.

The pulse generating part 220 generates a third intermediate pulse CLKB2 based on the third phase clock CLKA2 and the fifth phase clock CLKA4, and generates a fourth intermediate pulse CLKB6 based on the seventh phase clock CLKA6 and the first phase clock CLKA0. The clock synthesizing part 230 generates a second output clock CLKC2 based on the third intermediate pulse CLKB2 and the fourth intermediate pulse CLKB6.

The pulse generating part 220 generates a fifth intermediate pulse CLKB1 based on the second phase clock CLKA1 and the fourth phase clock CLKA3, and generates a sixth intermediate pulse CLKB5 based on a sixth phase clock CLKA5 and an eighth phase clock CLKA7. The clock synthesizing part 230 generates a third output clock CLKC1 based on the fifth intermediate pulse CLKB1 and the sixth intermediate pulse CLKB5.

The pulse generating part 220 generates a seventh intermediate pulse CLKB3 based on the fourth phase clock CLKA3 and the sixth phase clock CLKA5 of the eight phase clocks, and generates an eighth intermediate pulse CLKB7 based on the eighth phase clock CLKA7 and the second phase clock CLKA1 of the eight phase clocks. The clock synthesizing part 230 generates a fourth output clock CLKC3 based on the seventh intermediate pulse CLKB3 and the eighth intermediate pulse CLKB7.

Another operation of the oscillation circuit 200 has been described above. According to this oscillation circuit 200, it is possible to generate the four phase output clocks CLKC0 to CLKC3 having a period $T_C$ of half the oscillation period $T_A$ of the oscillator 210, i.e., having a double frequency.

Figure 5:
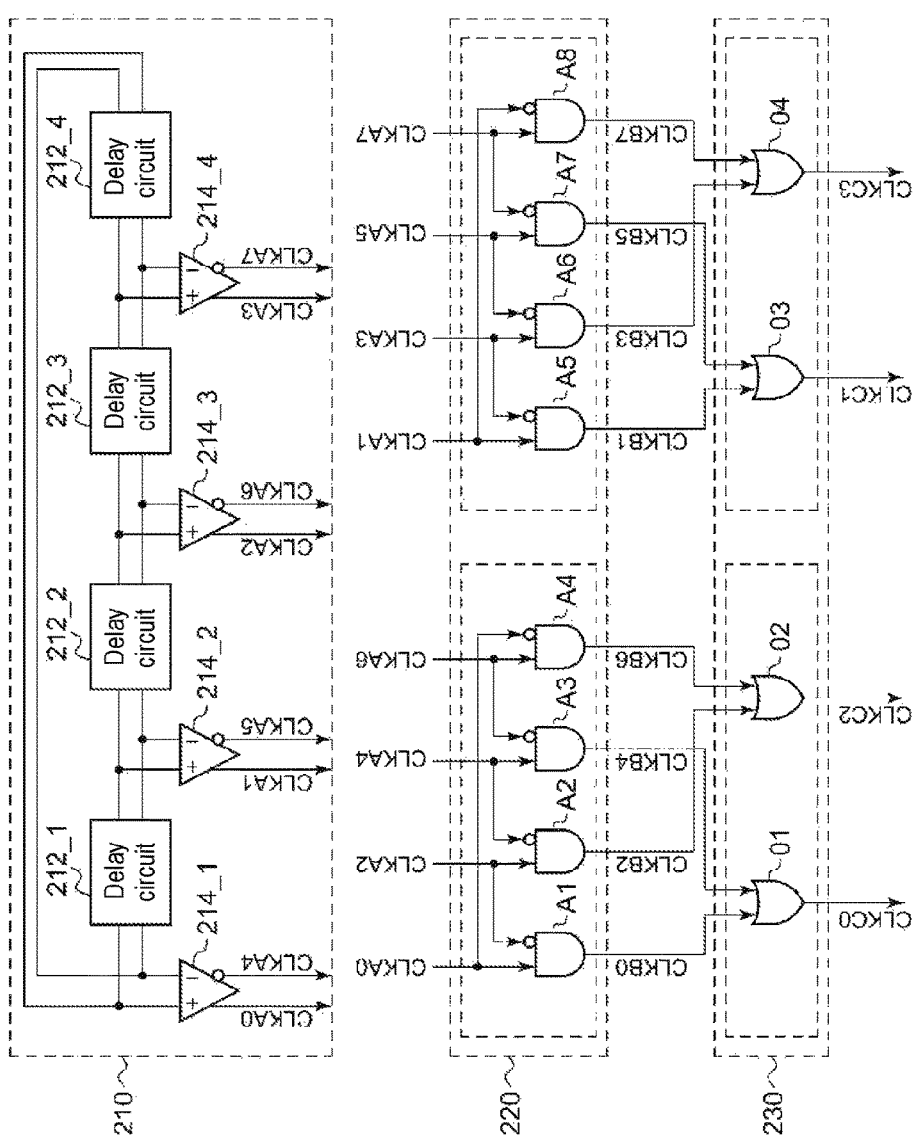
FIG. 5 is a circuit diagram of an oscillation circuit according to a second embodiment.

FIG. 5 is a circuit diagram of an oscillation circuit 200 according to a second embodiment. The oscillator 210 generates eight phase clocks CLKA0 to CLKA7 whose phases are shifted by 45°. The oscillator 210 has differential type even number four-stage delay circuits 212_1 to 212_4 connected to form a ring shape and comparators 214_1 to 214_4.

The pulse generating part 220 includes a set of first AND gate A1 to fourth AND gate A4 and a set of fifth AND gate A5 to eighth AND gate A8.

Clocks CLKA0, CLKA2, CLKA4, and CLKA6 according to the second embodiment correspond to the clocks CLKA0, CLKA1, CLKA2, and CLKA3 of the first embodiment. Thus, the set of first AND gate A1 to fourth AND gate A4 of FIG. 5 corresponds to the first AND gate A1 to fourth AND gate A4 of FIG. 3.

The fifth AND gate A5 to eighth AND gate A8 are configured in the same manner as the first AND gate A1 to fourth AND gate A4 to generate intermediate pulses CLKB1, CLKB3, CLKB5, and CLKB7 based on clocks CLKA1, CLKA3, CLKA5, and CLKA7.

The clock synthesizing part 230 has a set of first OR gate O1 and second OR gate O2 and a set of third OR gate O3 and fourth OR gate O4. The set of first OR gate O1 and second OR gate O2 corresponds to the first OR gate O1 and the second OR gate O2 of FIG. 3. The output clocks CLKC0 and CLKC2 of the second embodiment correspond to the output clocks CLKC0 and CLKC1 of the first embodiment.

The third OR gate O3 generates an output clock CLKC1 and the fourth OR gate O4 generates an output clock CLKC3.

According to the oscillation circuit 200 of FIG. 5, it is possible to generate the double frequency and the four phase output clocks CLKC0 to CLKC3 of FIG. 4.

Like FIG. 3, according to the configuration of the pulse generating part 220 and/or the method of generating an intermediate pulse of FIG. 5, both a positive edge and a negative edge of the intermediate pulse CLKB are defined by the positive edge of the multi-phase clock CLKA. Thus, the intermediate pulse CLKB is advantageous in that it is not affected by a variation in a duty ratio of the multi-phase clock CLKA.

(Applications)

Figure 6:
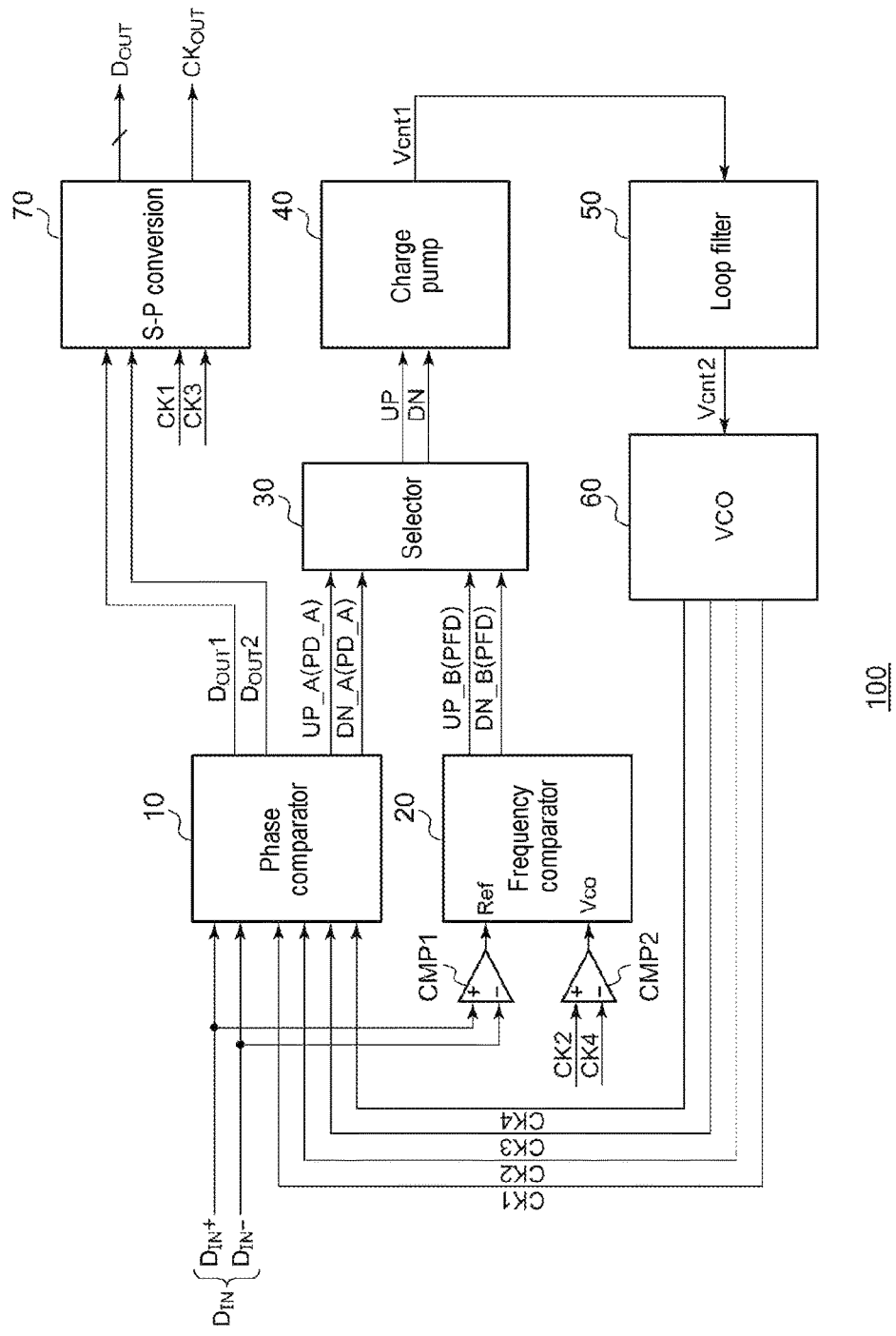
FIG. 6 is a block diagram illustrating a configuration of a CDR circuit according to an embodiment.

Next, applications of the oscillation circuit 200 will be described. The oscillation circuit 200 may be used in a serial data receiver, specifically in a clock data recovery (CDR) circuit 100. FIG. 6 is a block diagram illustrating a configuration of the CDR circuit 100 according to an embodiment. The CDR circuit 100 includes a phase comparator 10, a frequency comparator 20, a selector 30, a charge pump circuit 40, a loop filter 50, a voltage controlled oscillator (VCO) 60, and a serial-parallel converter 70.

The CDR circuit 100 receives serial type differential input data $D_{IN}+$ and $D_{IN}-$ (hereinafter, generally referred to simply as input data $D_{IN}$ as necessary). The input data $D_{IN}$ includes a clock signal. The CDR circuit 100 extracts and reproduces a clock signal from the input data $D_{IN}$, and receives a value of the input data $D_{IN}$ using the reproduced clock signal.

The CDR circuit 100 reproduces four phase clock signals CK1 to CK4 of a ½ frequency of a data rate. Also, the four phase clock signals CK1 to CK4 are shifted by ¼ period (90°) in phase. The four phase clock signals CK1 to CK4 are generated by a so-called PLL circuit.

The phase comparator 10 uses the first clock signal CK1 and the third clock signal CK3 whose phases are shifted by 180°, among the four phase clock signals CK1 to CK4, to obtain two data $D_{OUT}1$ and $D_{OUT}2$ at every period of the clock signals. Specifically, the phase comparator 10 latches a value of the input data $D_{IN}$ at a timing of a positive edge of the first clock signal CK1 and determines the value as data $D_{OUT}1$, and latches the value of the input data $D_{IN}$ at a timing of a positive edge of the third clock signal CK3 and determines the value as data $D_{OUT}2$. The data $D_{OUT}1$ and $D_{OUT}2$ are supplied to the serial-parallel converter 70 at the next stage. FIG. 7 is a time chart illustrating the timing of each signal in the CDR circuit 100 of FIG. 6.

The serial-parallel converter 70 receives the serial data $D_{OUT}1$ and $D_{OUT}2$ and the clock signals CK1 and CK3 synchronized therewith, and converts the same into output parallel data $D_{OUT}$ at the timing of the serial data $D_{OUT}1$ and $D_{OUT}2$. The serial-parallel converter 70 outputs the output parallel data $D_{OUT}$ together with the clock signal $CK_{OUT}$ synchronized therewith to a subsequent processing block.

Hereinafter, a configuration regarding the extraction and reproducing of the clock signals CK1 to CK4 of the CDR circuit 100 will be described.

The phase comparator 10, the charge pump circuit 40, the loop filter 50, and the VCO 60 form a so-called phase locked loop (PLL) circuit. Through this PLL circuit, a frequency and a phase of the clock signals CK1 to CK4 are feedback-controlled such that a timing of an edge of the second clock signal CK2 and a timing of an edge of the fourth clock signal CK4 correspond to a change point of the input data $D_{IN}$.

The VCO 60 oscillates at a frequency that is based on an input control voltage Vcnt2. The VCO 60 generates four phase clock signals CK1 to CK4. For example, the VCO 60 is a ring oscillator to which four-stage delay elements are connected to form a ring shape. Each of the delay elements is biased by the control voltage Vcnt2, and a delay amount of each of the delay elements is controlled by the control voltage Vcnt2. As a result, the oscillation frequency of the ring oscillator is based on the control voltage Vcnt2. The four phase clock signals CK1 to CK4 correspond to input signals (or output signals) of the four delay elements.

The VCO 60 may be configured by using the oscillation circuit 200 according to the embodiment, specifically, by using the oscillation circuit 200 of FIG. 5. That is, in the oscillator 210 of the oscillation circuit 200, a delay amount of the delay circuit 212 is configured to be variable according to the control voltage Vcnt2. The output clocks CLKC0 to CLKC3 of FIG. 5 correspond to the four phase clocks CK1 to CK4 of FIG. 6.

The phase comparator 10 receives the input data $D_{IN}$ and the clock signals CK1 to CK4. The phase comparator 10 compares a phase of the input data $D_{IN}$ with a phase of each of the clock signals CK1 to CK4 to generate an up signal UP_A and a down signal DN_A. The up signal UP_A and the down signal DN_A will also be generally referred to as a phase difference signal PD_A.

When a phase of the clock signal CK is behind with respect to the input data $D_{IN}$, the up signal UP_A is asserted (high level), and when the phase of the clock signal CK is ahead with respect to the input data $D_{IN}$, the down signal DN_A is asserted.

The phase difference signal PD_A is input to the charge pump circuit 40 through the selector 30. The charge pump circuit 40 increases a control voltage Vcnt1 when the up signal UP_A is asserted, and lowers the control voltage Vcnt1 when the down signal DN_A is asserted. The loop filter 50 is a lag lead filter and adjusts a high frequency component of the control voltage Vcnt1 to generate the control voltage Vcnt2. A low pass filter may be used as the loop filter 50.

The configuration of the charge pump circuit 40 is not limited, but it includes, for example, a capacitor, a charge circuit for charging the capacitor according to the up signal UP_A, and a discharge circuit for discharging the capacitor according to the down signal DN_A. The control voltage Vcnt2 is output to the VCO 60.

When a phase of the clock signal CK is lagged and the up signal UP_A is asserted, a frequency of the clock signal CK is increased due to an increase in the control voltage Vcnt2, and thus, feedback is applied to advance the phase. Conversely, when the phase of the clock signal CK is advanced and the down signal DN_A is asserted, the frequency of the clock signal CK is lowered due to lowering of the control voltage Vcnt2, and thus, feedback is applied to make the phase lagged. As a result, the frequency and phase of the clock signal CK are optimized with respect to a change point (edge) of the input data $D_{IN}$.

In addition to the PLL circuit described above, the CDR circuit 100 includes a frequency locked loop (FLL) circuit formed by the frequency comparator 20, the charge pump circuit 40, the loop filter 50, and the VCO 60.

The frequency and phase of the clock signals CK1 to CK4 are feedback-controlled by the FLL circuit such that the periods of the clock signals CK2 and CK4 correspond to a data period Td of the input data $D_{IN}$. Also, the loop of the FLL circuit may be omitted.

The first comparator CMP1 compares input data $D_{IN}$+ and $D_{IN}$− to generate a reference signal Ref. Also, the second comparator CMP2 compares the clock signals CK2 and CK4 to generate a signal Vco. The frequency comparator 20 compares the reference signal Ref and the signal Vco to generate a phase frequency difference signal PFD corresponding to a phase difference therebetween. The phase frequency difference signal PH) indicates whether a phase of the signal Vco is advanced or lagged with respect to the phase of the reference signal Ref. Like the phase difference signal PD, the phase frequency difference signal PFD includes an up signal UP_B and a down signal DN_B. When the phase of the signal Vco is lagged, the up signal UP_B is asserted, and when the phase of the signal Vco is advanced, the down signal DN_B is asserted.

The phase frequency difference signal PFD is input to the charge pump circuit 40 through the selector 30. The operations of the charge pump circuit 40, the loop filter 50, and the VCO 60 are the same as described above. Upon receipt of the phase difference signal PD and the phase frequency difference signal PFD, the selector 30 generates a control signal (UP/DN).

A frequency and a phase of the clock signals CK1 to CK4 are feedback-controlled by the FLL circuit such that an interval between a positive edge of the clock signal CK2 and a positive edge of the clock signal CK4 corresponds to a period of the input data $D_{IN}$.

The overall configuration of the CDR circuit 100 has been described above. It is possible to reproduce high speed clock signals CK0 to CK3 synchronized with the serial data at a high speed of a few GHz by using the oscillation circuit 200 according to the embodiment in the CDR circuit 100.

The present disclosure has been described above based on the embodiments. It is to be understood by those skilled in the art that the embodiments are merely illustrative and may be variously modified by any combination of the components or processes, and the modifications are also within the scope of the present disclosure. Hereinafter, these modifications will be described.

(First Modification)

Figure 8A:
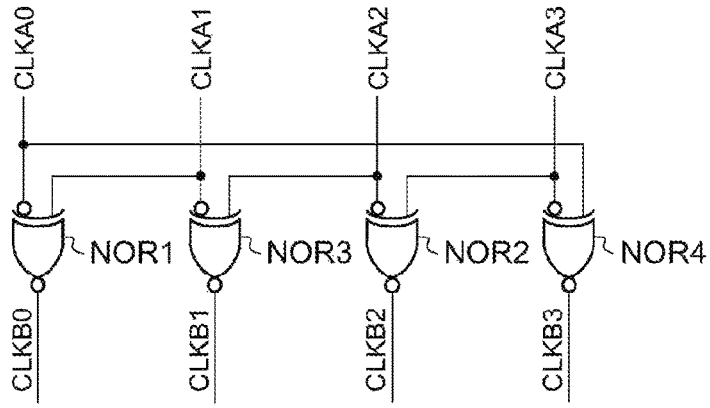
FIGS. 8A to 8C are circuit diagrams of pulse generating parts according to first to third modifications.

The configuration of the pulse generating part 220 is not limited to that of FIG. 3. FIG. 8A is a circuit diagram of a pulse generating part 220a according to a first modification. The pulse generating part 220a includes NOR gates NOR1 to NOR 4 instead of the first AND gate A1. Each of the NOR gates performs a negative logical sum (NOR) of an inverted signal of a multi-phase clock CLKA at one side and the multi-phase clock CLKA at the other side to generate an intermediate pulse CLKB. Also, according this modification, it is possible to obtain the same effects as those of the pulse generating parts 220 of FIGS. 3 and 5.)

(Second Modification)

In the embodiment, both the positive edge and the negative edge of the intermediate pulse CLKB are defined by the positive edge of the multi-clock CLKA, but the present disclosure is not limited thereto. That is, the positive edge and the negative edge of the intermediate pulse CLKB may also be defined by the negative edge of the multi-phase clock CLKA. In other words, both the positive edge and the negative edge of the intermediate pulse CLKB may be defined by the common edge having the same polarity of the multi-phase clock.

Figure 8B:
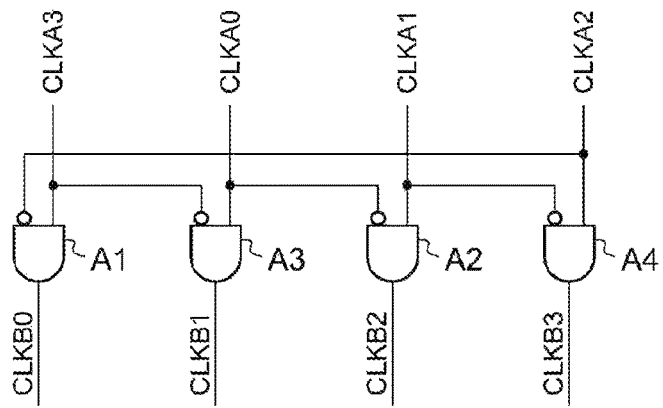
Figure 8C:
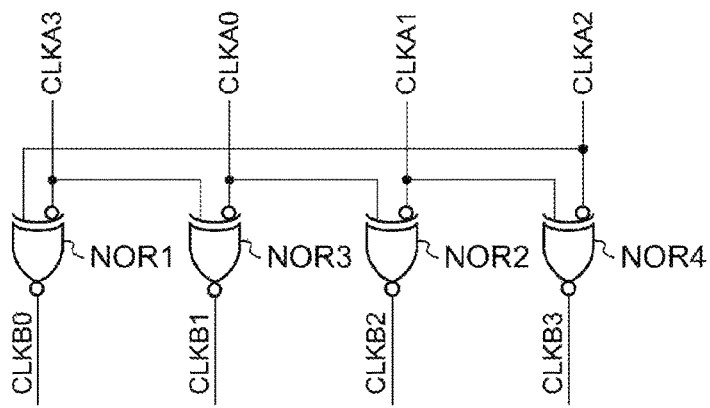

In this case, the multi-phase pulse input to the AND gates of FIGS. 3 and 5 may be changed. FIG. 8B is a circuit diagram of a pulse generating part 220b according to a second modification. FIG. 8C is a circuit diagram of a pulse generating part 220c according to a third modification.

(Third Modification)

The configurations of the pulse generating part 220 and the clock synthesizing part 230 are not limited to those described in the embodiments or modifications, but it is understood by those skilled in the art that various modifications may be designed and those modifications are also included within the scope of the present disclosure.

(Fourth Modification)

Figure 9:
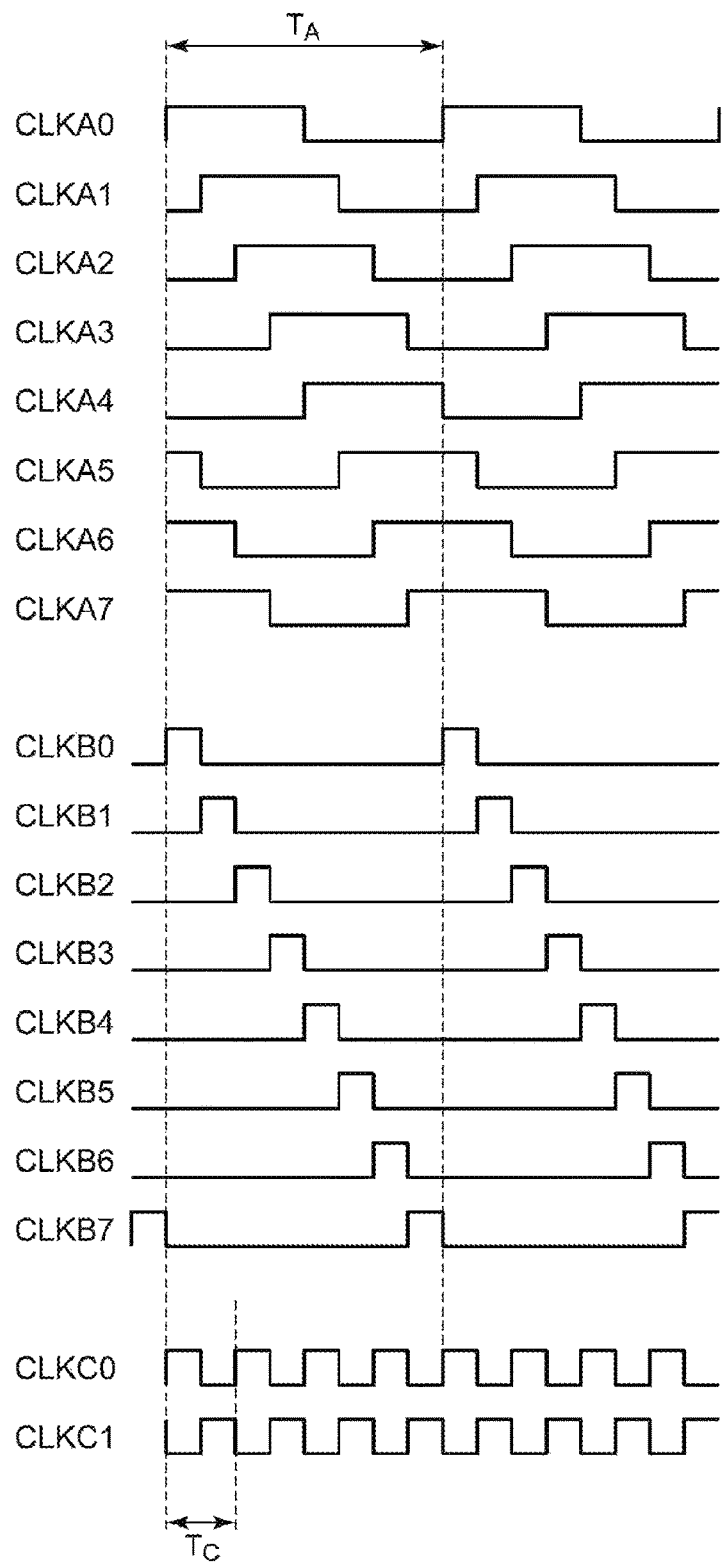
FIG. 9 is an operational waveform view of an oscillation circuit according to a fourth modification.

FIG. 9 is an operational waveform view of an oscillation circuit 200 according to a fourth modification. In FIG. 4, a duty ratio of the intermediate pulse generated by the pulse generating part 220 is equally 25%, but the present disclosure is not limited thereto. When the N phase clocks CLKA0 to CLKA(N−1) are generated by the oscillator 210, the pulse generating part 220 may generate an intermediate pulse having a duty ratio of (100/N) % using a pair of clocks CLKA that are (360/N)° out of phase with each other. In a configuration of the pulse generating part 220, the inputs of respective logic gates may be properly changed, like those as described in the embodiments or the modifications.

Upon receipt of the intermediate pulse having a duty ratio of (100/N) %, the clock synthesizing part 230 generates a single phase or multi-phase output clocks having a $2^K$-times frequency (where K is a natural number) of the oscillation frequency of the oscillator 210.

(Fifth Modification)

In the embodiment, the case in which two phase or four phase output clocks are generated has been described as an example, but the technical concept disclosed in the embodiment may also be applied to the cases of generating eight phase clocks, sixteen phase clocks, or any other output clocks, and it is understood by those skilled in the art that these cases are included within the scope of the present disclosure.

(Sixth Modification)

The applications of the oscillation circuit 200 are not limited to the CDR circuit, but it may be used for a serial data transmitter and a serial data receiver of the type in which a clock is transmitted via a clock line.

(Seventh Modification)

Although the present disclosure has been described using specific terms based on the embodiments, the embodiments are merely intended to illustrate the principle and applications of the present disclosure and the embodiments may be variously modified and arranged within a range that does not depart from the spirit of the present disclosure defined in the claims.

According to the present disclosure in some embodiments, it is possible to generate a high speed clock.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An oscillation circuit, comprising:
an oscillator configured to generate N phase clocks (where N is an integer of 2 or more) including a first phase clock to Nth phase clock whose phases are shifted by 360°/N at regular intervals;
a pulse generating part configured to receive a plurality of the N phase clocks and generate a plurality of intermediate pulses each having a duty ratio of 25%; and
a clock synthesizing part configured to synthesize the plurality of intermediate pulses to generate a single phase output clock or multi-phase output clocks, the single phase output clock and the multi-phase output clocks having a frequency that is twice an oscillation frequency of the oscillator,
wherein the pulse generating part is configured to generate one intermediate pulse from a pair of clocks that are 90° out of phase with each other, and
wherein, in the pulse generating part, a positive edge and a negative edge of the intermediate pulse are based on an edge having the same polarity of the pair of clocks as a basis of the intermediate pulse.

2. The oscillation circuit of claim 1, wherein the pulse generating part is configured to invert one of the pair of clocks and perform a logical product of an inverted clock and the other clock to generate one intermediate pulse.

3. The oscillation circuit of claim 1, wherein the pulse generating part is configured to invert one of the pair of clocks and perform a negative logical sum of an inverted clock and the other clock to generate one intermediate pulse.

4. The oscillation circuit of claim 1, wherein the clock synthesizing part is configured to perform a logical sum of a pair of intermediate pulses that are 180° out of phase to generate one output clock.

5. The oscillation circuit of claim 1, wherein the oscillator is configured to generate four phase clocks whose phases are shifted by 90°,
the pulse generating part is configured to generate a first intermediate pulse based on a first phase clock and a second phase clock of the four phase clocks, and a second intermediate pulse based on a third phase clock and a fourth phase clock of the four phase clocks, and the clock synthesizing part is configured to generate a first output clock based on the first intermediate pulse and the second intermediate pulse.

6. The oscillation circuit of claim 5, wherein the pulse generating part is configured to generate a third intermediate pulse based on the second phase clock and the third phase clock of the four phase clocks, and a fourth intermediate pulse based on the fourth phase clock and the first phase clock of the four phase clocks, and
the clock synthesizing part is configured to generate a second output clock based on the third intermediate pulse and the fourth intermediate pulse.

7. The oscillation circuit of claim 1, wherein the oscillator is configured to generate four phase clocks whose phases are shifted by 90°,
the pulse generating part comprises:
a first AND gate configured to generate a logical product of a first phase clock of the four phase clocks and an inverted signal of a second phase clock; and
a second AND gate configured to generate a logical product of a third phase clock of the four phase clocks and an inverted signal of a fourth phase clock, and
the clock synthesizing part comprises a first OR gate configured to generate a logical sum of an output of the first AND gate and an output of the second AND gate.

8. The oscillation circuit of claim 7, wherein the pulse generating part further comprises:
a third AND gate configured to generate a logical product of the second phase clock of the four phase clocks and an inverted signal of the third phase clock; and
a fourth AND gate configured to generate a logical product of the fourth phase clock of the four phase clocks and an inverted signal of the first phase clock, and
the clock synthesizing part further comprises a second OR gate configured to generate a logical sum of an output of the third AND gate and an output of the fourth AND gate.

9. The oscillation circuit of claim 1, wherein the oscillator is configured to generate eight phase clocks whose phases are shifted by 45°,
the pulse generating part is configured to generate a first intermediate pulse based on a first phase clock and a third phase clock of the eight phase clocks and a second intermediate pulse based on a fifth phase clock and a seventh phase clock of the eight phase clocks, and
the clock synthesizing part is configured to generate a first output clock based on the first intermediate pulse and the second intermediate pulse.

10. The oscillation circuit of claim 9, wherein the pulse generating part is configured to generate a third intermediate pulse based on the third phase clock and the fifth phase clock of the eight phase clocks and a fourth intermediate pulse based on the seventh phase clock and the first phase clock of the eight phase clocks, and
the clock synthesizing part is configured to generate a second output clock based on the third intermediate pulse and the fourth intermediate pulse.

11. The oscillation circuit of claim 9, wherein the pulse generating part is configured to generate a fifth intermediate pulse based on a second phase clock and a fourth phase clock of the eight phase clocks and a sixth intermediate pulse based on a sixth phase clock and an eighth phase clock of the eight phase clocks, and
the clock synthesizing part is configured to generate a third output clock based on the fifth intermediate pulse and the sixth intermediate pulse.

12. The oscillation circuit of claim 11, wherein the pulse generating part is configured to generate a seventh intermediate pulse based on the fourth phase clock and the sixth phase clock of the eight phase clocks and an eighth intermediate pulse based on the eighth phase clock and the second phase clock of the eight phase clocks, and
the clock synthesizing part is configured to generate a fourth output clock based on the seventh intermediate pulse and the eighth intermediate pulse.

13. The oscillation circuit of claim 1, wherein the oscillator is configured to generate eight phase clocks whose phases are shifted by 45°,
the pulse generating part comprises:
a first AND gate configured to generate a logical product of a first phase clock of the eight phase clocks and an inverted signal of a third phase clock;
a second AND gate configured to generate a logical product of the third phase clock of the eight phase clocks and an inverted signal of a fifth phase clock;
a third AND gate configured to generate a logical product of the fifth phase clock of the eight phase clocks and an inverted signal of a seventh phase clock; and
a fourth AND gate configured to generate a logical product of the seventh phase clock of the eight phase clocks and an inverted signal of the first phase clock, and
the clock synthesizing part comprises:
a first OR gate configured to generate a logical sum of an output of the first AND gate and an output of the third AND gate; and
a second OR gate configured to generate a logical sum of an output of the second AND gate and an output of the fourth AND gate.

14. The oscillation circuit of claim 13, wherein the pulse generating part comprises:
a fifth AND gate configured to generate a logical product of a second phase clock of the eight phase clocks and an inverted signal of a fourth phase clock;
a sixth AND gate configured to generate a logical product of the fourth phase clock of the eight phase clocks and an inverted signal of a sixth phase clock;
a seventh AND gate configured to generate a logical product of the sixth phase clock of the eight phase clocks and an inverted signal of an eighth phase clock; and
an eighth AND gate configured to generate a logical product of the eighth phase clock of the eight phase clocks and an inverted signal of the second phase clock, and
the clock synthesizing part comprises:
a third OR gate configured to generate a logical sum of an output of the fifth AND gate and an output of the seventh AND gate; and
a fourth OR gate configured to generate a logical sum of an output of the sixth AND gate and an output of the eighth AND gate.

15. An oscillation circuit, comprising:
an oscillator configured to generate N phase clocks (where N is an integer of 2 or more) including a first phase clock to Nth phase clock whose phases are shifted by 360°/N at regular intervals;
a pulse generating part configured to receive the N phase clocks and generate a plurality of intermediate pulses each having a duty ratio of (100/N) %; and
a clock synthesizing part configured to synthesize the plurality of intermediate pulses to generate a single phase output clock or multi-phase output clocks, the single phase output clock and the multi-phase output clocks having a $2^K$-times frequency (where K is a natural number) of an oscillation frequency of the oscillator, wherein the pulse generating part is configured to generate one intermediate pulse from a pair of clocks that are 90° out of phase with each other, and wherein, in the pulse generating part, a positive edge and a negative edge of the intermediate pulse are based on an edge having the same polarity of the pair of clocks as a basis of the intermediate pulse.

16. The oscillation circuit of claim 1, wherein the oscillator comprises differential type even number stage delay circuits connected to form a ring shape.

17. A voltage controlled oscillator comprising the oscillation circuit of claim 1.

18. A serial data receiver comprising the oscillation circuit of claim 1.

* * * * *